United States Patent [19]
Saito et al.

[11] Patent Number: 6,122,151
[45] Date of Patent: Sep. 19, 2000

[54] SPIN-VALVE MAGNETORESISTIVE ELEMENT

[75] Inventors: Masamichi Saito; Toshinori Watanabe, both of Niigata-ken, Japan

[73] Assignee: Alps Electric Co., Ltd., Tokyo, Japan

[21] Appl. No.: 09/376,937

[22] Filed: Aug. 18, 1999

Related U.S. Application Data

[62] Division of application No. 09/081,955, May 19, 1998.

[30] Foreign Application Priority Data

Jun. 6, 1997 [JP] Japan ................... 9-149318

[51] Int. Cl.⁷ ..................................... G11B 5/39
[52] U.S. Cl. ..................................... 360/324.12
[58] Field of Search ................... 360/113, 126, 360/324, 324.1, 324.11, 324.12; 324/252; 338/32 R

[56] References Cited

U.S. PATENT DOCUMENTS

| | | | |
|---|---|---|---|
| 5,018,037 | 5/1991 | Krounbi et al. | 360/113 |
| 5,079,035 | 1/1992 | Krounbi et al. | 360/113 |
| 5,206,590 | 4/1993 | Dieny et al. | 360/113 |
| 5,315,468 | 5/1994 | Lin et al. | 360/113 |
| 5,329,413 | 7/1994 | Konodoh et al. | 360/113 |
| 5,608,593 | 3/1997 | Kim et al. | 360/113 |
| 5,739,990 | 4/1998 | Ravipati et al. | 360/113 |
| 5,748,416 | 5/1998 | Tobise et al. | 360/113 |
| 5,892,641 | 4/1999 | Ishiwata | 360/113 |

*Primary Examiner*—David L. Ometz
*Attorney, Agent, or Firm*—Brinks Hofer Gilson & Lione

[57] ABSTRACT

A spin-valve magnetoresistive element includes a hard bias layer formed on a pinned magnetic layer with a non-magnetic layer therebetween, and thus the magnetic field from the hard bias layer is efficiently applied into a free magnetic layer. Also, the pinned magnetic layer is not influenced by the hard bias layer because of the interposition of the non-magnetic layer. Accordingly, the pinned magnetic layer and the free magnetic layer are properly put into single magnetic domain states, and thus, Barkhausen noise is reduced and satisfactory micro-track-asymmetry can be obtained.

3 Claims, 4 Drawing Sheets

SPIN-VALVE MAGNETORESISTIVE ELEMENT

This is a Divisional of application Ser. No. 09/081,955, filed May 19, 1998, which is currently pending.

BACKGROUND OF THE INVENTION

1. Field of the Invention

The present invention relates to a spin-valve magnetoresistive element in which electrical resistance changes in response to the relationship between the magnetic direction of a pinned magnetic layer and the magnetic direction of a free magnetic layer which is influenced by an external magnetic field, and more particularly relates to a spin-valve magnetoresistive element in which the magnetizations of a pinned magnetic layer and a free magnetic layer are properly put into single magnetic domain states so that Barkhausen noise is reduced and satisfactory micro-track-asymmetry can be obtained.

2. Description of the Related Art

FIG. 4 is a sectional view which shows the conventional structure of a spin-valve magnetoresistive element (spin-valve magnetoresistive head) which detects a recording magnetic field from a recording medium such as a hard disk.

This spin-valve magnetoresistive element includes an antiferromagnetic layer 1, a pinned magnetic layer 2, a non-magnetic electrically conductive layer 3, and a free magnetic layer 4 deposited in that order, and hard bias layers 5 and 5 formed on both sides thereof.

Generally, an iron-manganese (Fe—Mn) alloy film or a nickel-manganese (Ni—Mn) alloy film is used for the antiferromagnetic layer 1, an iron-nickel (Fe—Ni) alloy film is used for the pinned magnetic layer 2 and the free magnetic layer 4, a copper (Cu) film is used for the non-magnetic electrically conductive layer 3, and a cobalt-platinum (Co—Pt) alloy film or the like is used for the hard bias layers 5 and 5. Also, an underlying layer 6 and a protective layer 7 are composed of a non-magnetic material, for example, tantalum (Ta).

As shown in the drawing, the antiferromagnetic layer 1 and the pinned magnetic layer 2 are formed in contact with each other, the pinned magnetic layer 2 is put into a single magnetic domain state in the Y direction by an exchange anisotropic magnetic field caused by exchange coupling at the interface between the pinned magnetic layer 2 and the antiferromagnetic layer 1, and the magnetic direction is pinned in the Y direction. The exchange anisotropic magnetic field occurs at the interface between the antiferromagnetic layer 1 and the pinned magnetic layer 2 by annealing (heat treatment) while applying the magnetic field in the Y direction.

Also, the magnetic direction of the free magnetic layer 4 is aligned in the X direction under the influence of the hard bias layers 5 and 5 which are magnetized in the X direction.

A method for fabricating the spin-valve magnetoresistive element shown in FIG. 4 includes the steps of depositing six layers from the underlying layer 6 to the protective layer 7, scraping the sides of the six layers so as to have inclined edges in the etching process, for example, by ion-milling, and then, depositing hard bias layers 5 and 5 on opposite sides of the six layers.

In the spin-valve magnetoresistive element, a stationary electric current (sensing current) is applied from electrically conductive layers 8 and 8 formed on the hard bias layers 5 and 5 into the pinned magnetic layer 2, the non-magnetic electrically conductive layer 3, and the free magnetic layer 4. The driving direction of a recording medium such as a hard disk is in the Z direction, and if a magnetic field leaked from the recording medium is applied in the Y direction, the magnetization of the free magnetic layer 4 changes from the X direction to the Y. Because of the relationship between the change in the magnetic direction in the free magnetic layer 4 and the pinned magnetic direction of the pinned magnetic layer 2, the electrical resistance changes, and the magnetic field leaked from the recording medium can be detected by the voltage change based on the change in the electrical resistance.

In the conventional spin-valve magnetoresistive element shown in FIG. 4, however, there are the following problems.

As described above, although the magnetization of the pinned magnetic layer 2 is pinned in the Y direction (shown in the drawing), the hard bias layers 5 and 5 magnetized in the X direction are provided on both sides of the pinned magnetic layer 2. Therefore, the magnetization of, in particular, both ends of the pinned magnetic layer 2 is influenced by the bias magnetic field from the hard bias layers 5 and 5, and is not pinned in the Y direction (shown in the drawing).

That is, in the spin-valve magnetoresistive element, it is preferable that the magnetization of the pinned magnetic layer 2 and the magnetization of the free magnetic layer 4 be put into single magnetic domain states in the Y direction and in the X direction, respectively, and that the magnetization of the pinned magnetic layer 2 be orthogonal to that of the free magnetic layer 4 in the entire region. However, the magnetization relationship between the pinned magnetic layer 2 and the free magnetic layer 4 around both ends is not orthogonal because the magnetization of the pinned magnetic layer 2 is not pinned in the Y direction, and satisfactory micro-track-asymmetry cannot be obtained around both ends. The word "micro-track-asymmetry" means the vertical asymmetry of the regenerated output waveform measured in a track width which is smaller than the real track width.

If the regenerated output value has the same height at every part when micro-track-asymmetry is measured, the micro-track-asymmetry is considered to be in a satisfactory condition. However, when the micro-track-asymmetry is measured around both ends of the pinned magnetic layer 2 and the free magnetic layer 4 shown in FIG. 4, the regenerated output value has non-uniform height. That is, the micro-track-asymmetry is in the deteriorated condition, which makes it difficult to detect the track position accurately and easily leads to a servo error.

Also, in addition to the above-mentioned problem, in the spin-valve magnetoresistive element shown in FIG. 4, the hard bias layers 5 and 5 provided on opposite sides of the free magnetic layer 4 are substantially thin, and thus, a sufficient bias magnetic field cannot be applied from the hard bias layers 5 and 5 to the free magnetic layer 4 in the X direction. Accordingly, the magnetic direction of the free magnetic layer 4 is not stabilized easily in the X direction, and Barkhausen noise easily occurs.

SUMMARY OF THE INVENTION

The present invention overcomes the problems noted above with respect to the related art. It is an object of the present invention to provide a spin-valve magnetoresistive element in which a sufficient bias magnetic field is applied from a hard bias layer into a free magnetic layer while the hard bias layer does not influence the magnetization of a pinned magnetic layer so that the magnetizations of the pinned magnetic layer and the free magnetic layer are properly put into single magnetic domain states in given directions, and thus satisfactory micro-track-asymmetry can be obtained, and also Barkhausen noise can be reduced.

In a spin-valve magnetoresistive element in accordance with the present invention, a pinned magnetic layer is formed on an antiferromagnetic layer, wherein the magnetic direction is pinned by an exchange anisotropic magnetic field between the pinned magnetic layer and the antiferromagnetic layer. A non-magnetic electrically conductive layer and a free magnetic layer are deposited thereon, and also, a bias layer for aligning the magnetic direction of the free magnetic layer in the direction perpendicular to the magnetic direction of the pinned magnetic layer, and an electrically conductive layer for applying a sensing current into the pinned magnetic layer, the non-magnetic electrically conductive layer, and the free magnetic layer are provided. The antiferromagnetic layer and the pinned magnetic layer extend to the regions beside both sides of the non-magnetic electrically conductive layer and the free magnetic layer. The bias layer and an electrode layer are deposited on the pinned magnetic layer in the regions beside both sides with a non-magnetic layer therebetween.

FIG. 1 can be referred to as an embodiment of the present invention.

Also, it is preferable that the non-magnetic layer is composed of a metal layer having a body-centered cubic structure and (100) orientation.

Also, in a spin-valve magnetoresistive element in accordance with the present invention, a pinned magnetic layer is formed on an antiferromagnetic layer, wherein the magnetic direction is pinned by an exchange anisotropic magnetic field with the antiferromagnetic layer. A non-magnetic electrically conductive layer and a free magnetic layer are deposited thereon, and also, a bias layer for aligning the magnetic direction of the free magnetic layer in the direction perpendicular to the magnetic direction of the pinned magnetic layer, and an electrically conductive layer for applying a sensing current into the pinned magnetic layer, the non-magnetic electrically conductive layer, and the free magnetic layer are provided. The antiferromagnetic layer, the pinned magnetic layer, and the non-magnetic electrically conductive layer extend to the regions beside both sides of the free magnetic layer, and the bias layer and an electrode layer are deposited on the non-magnetic electrically conductive layer in the regions beside both sides.

FIG. 2 can be referred to as an embodiment of the present invention.

It is preferable that a non-magnetic metal layer having a body-centered cubic structure and (100) orientation is formed between the non-magnetic electrically conductive layer and the bias layer.

In the present invention, Cr, Ti, Mo, or $W_{50}Mo_{50}$ can be presented as the non-magnetic metal layer having a body-centered cubic structure and (100) orientation.

Also, in a spin-valve magnetoresistive element in accordance with the present invention, a pinned magnetic layer is formed on an antiferromagnetic layer, wherein the magnetic direction is pinned by an exchange anisotropic magnetic field between the pinned magnetic layer and the antiferromagnetic layer. A non-magnetic electrically conductive layer and a free magnetic layer are deposited thereon, and also, a bias layer for aligning the magnetic direction of the free magnetic layer in the direction perpendicular to the magnetic direction of the pinned magnetic layer, and an electrically conductive layer for applying a sensing current into the pinned magnetic layer, the non-magnetic electrically conductive layer, and the free magnetic layer are provided. A ferromagnetic layer having a body-centered cubic structure and (100) orientation is formed on the free magnetic layer beside both ends of a cutout section provided between the ferromagnetic layer, and the bias layer and an electrode layer are deposited on the ferromagnetic layer.

FIG. 3 can be referred to as an embodiment of the present invention.

It is preferable that the ferromagnetic layer be composed of an Fe—X (X=Rh, Cr, Ti, Zr, Hf, V, Nb, Ta, Mn, Ru, Pd, Pt) alloy or an Fe—Co—Ni alloy.

In accordance with the present invention, as shown in FIG. 1 and FIG. 2, since both sides of a free magnetic layer 4 are scraped so as to have inclined edges, a hard bias layer 5 is formed on a pinned magnetic layer 2 with a non-magnetic layer (a non-magnetic layer 9 in FIG. 1, and a non-magnetic electrically conductive layer 3 in the T2 region in FIG. 2) therebetween, the thick parts of the hard bias layer 5 which generates a strong bias magnetic field are provided on opposite sides of the free magnetic layer 4, and thus a sufficient bias magnetic field is applied from the hard bias layer 5 into the free magnetic layer 4. Also, the hard bias layer 5 is formed apart from the pinned magnetic layer 2, without lying on opposite sides of the pinned magnetic layer 2, and therefore, the magnetic field from the hard bias layer 5 is not applied into the pinned magnetic layer 2, and is intensively applied into the free magnetic layer 4 with efficiency.

The non-magnetic layer 9 in FIG. 1 is composed of a metal layer having a body-centered cubic structure and (100) orientation, and preferably, in FIG. 2, the metal layer is formed on the non-magnetic electrically conductive layer 3 in the T2 region. In such a structure, a coercive force Hc and a squareness ratio S of the hard bias layer 5 increase and the bias magnetic field from the hard bias layer 5 increases.

Because of the structure described above, the free magnetic layer 4 shown in FIG. 1 and FIG. 2 is properly put into a single magnetic domain state in the direction (the X direction in the drawing) which is orthogonal to the magnetic direction of the pinned magnetic layer 2 in the entire region.

Also, since a non-magnetic layer is formed below the hard bias layer 5, a ferromagnetic coupling does not occur between the hard bias layer and the pinned magnetic layer 2, and the magnetization from the hard bias layer 5 is shielded by the non-magnetic layer and does not influence the magnetization of the pinned magnetic layer 2.

As described above, the pinned magnetic layer 2 in accordance with the present invention is not influenced by the magnetic field from the hard bias layer 5, differing from the conventional pinned magnetic layer 2. Therefore, the magnetization of the pinned magnetic layer 2 shown in FIG. 1 and FIG. 2 is pinned in a given direction (the Y direction in the drawing) in the entire region. Also, in contrast with the related art, the pinned magnetic layer 2 and the antiferromagnetic layer 1 extend to the T1 region (in FIG. 1) and the T2 region (in FIG. 2) below the hard bias layer 5. Thus, the pinned magnetic layer 2 is pinned in the Y direction in a wider range than the track width, enabling further prevention in fluctuation of the magnetization of the pinned magnetic layer 2 owing to the magnetic field from a magnetic recording medium.

Also, in FIG. 3, a hard bias layer 5 is formed on a free magnetic layer 4 with a ferromagnetic layer 10 therebetween, beside both ends of a cut-out section (in the T3 region).

Because of the ferromagnetic coupling at the interface between the hard bias layer 5 and the ferromagnetic layer 10 and at the interface between the ferromagnetic layer 10 and the free magnetic layer 4 in the T3 region, the free magnetic layer 4 is easily and properly put into a single magnetic domain state in the direction (the X direction) which is orthogonal to the magnetization of the pinned magnetic layer 2.

Also, since the hard bias layer 5 is formed apart from the pinned magnetic layer 2, the magnetic field leaked from the hard bias layer 5 does not influence the magnetization of the pinned magnetic layer 2, and thus, the magnetization of the pinned magnetic layer 2 in FIG. 3 is properly pinned in a given direction (the Y direction in the drawing) in the entire region.

As described above, in accordance with the present invention, the pinned magnetic layer 2 and the free magnetic layer 4 are properly put into single magnetic domain states in given directions (orthogonal to each other) in the entire region, and thus satisfactory micro-track-asymmetry can be obtained, resulting in the prevention of a servo error. Also, since the pinned magnetic layer 2 and the free magnetic layer 4 are properly put into single magnetic domain states, Barkhausen noise does not easily occur.

DESCRIPTION OF THE PREFERRED EMBODIMENTS

Figure 1:
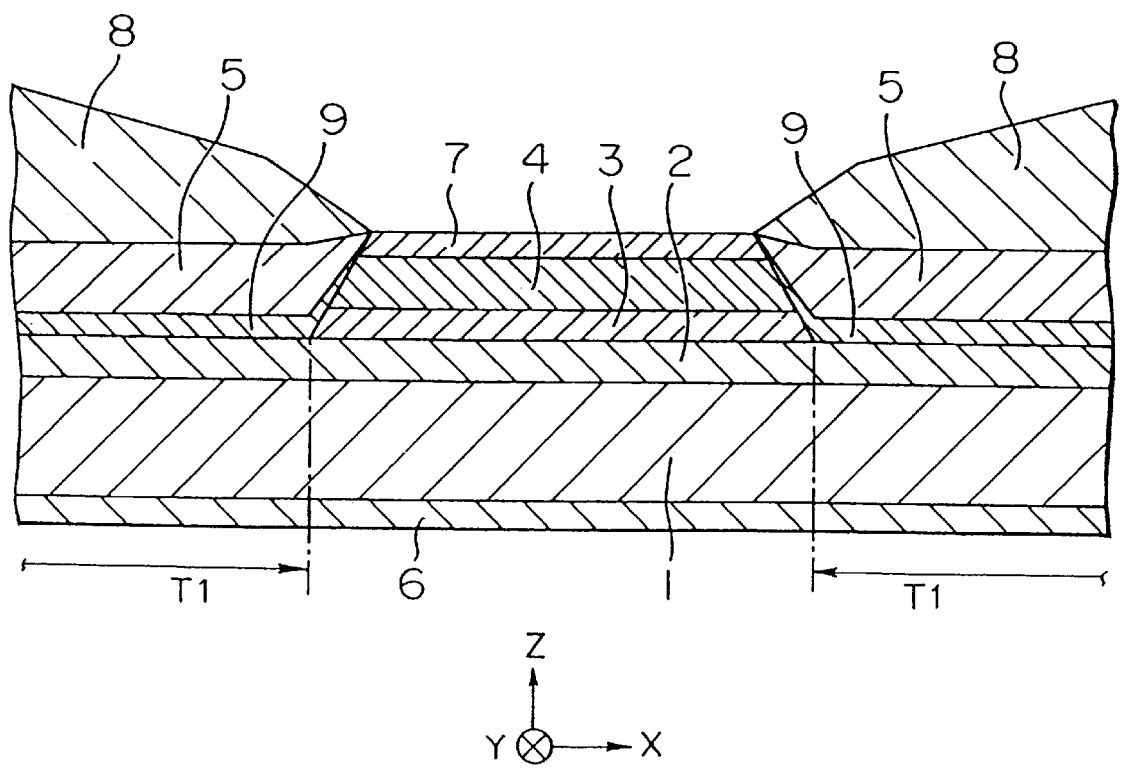
FIG. 1 is a sectional view which shows the structure of a spin-valve magnetoresistive element as a first embodiment of the present invention.

FIG. 1 is a sectional view which shows the structure of a spin-valve magnetoresistive element as a first embodiment of the present invention. The sectional view is taken in the central part of the element which stretches in the X direction.

The spin-valve magnetoresistive head is provided, for example, on the end of the trailing side of a levitated slider in a hard disk drive for detecting a recording magnetic field of a hard disk or the like. A magnetic recording medium such as a hard disk moves in the Z direction while the magnetic field leaked from the magnetic recording medium is directed in the Y direction.

An underlying layer 6 formed in the lowest part shown in FIG. 1 is composed of a non-magnetic material, for example, tantalum (Ta). An antiferromagnetic layer 1 and a pinned magnetic layer 2 are deposited on the underlying layer 6. The antiferromagnetic layer 1 and the pinned magnetic layer 2 under deposition are heat-treated in a magnetic field having a given dimension, and thus an exchange anisotropic magnetic field is obtained in the interface between both layers, and the magnetic direction of the pinned magnetic layer 2 is put into a single magnetic domain state and pinned in the Y direction.

In accordance with the present invention, a platinum-manganese (Pt—Mn) alloy is used for the antiferromagnetic layer 1. The Pt—Mn alloy has excellent properties as an antiferromagnetic material because of superior corrosion resistance to an Fe—Mn alloy or the like, and a high blocking temperature, and also because an exchange anisotropic magnetic field can be obtained at a heat-treatment temperature of 230° C. (a heating temperature at the hard baking process of an ultraviolet radiation curing resin) or less.

Instead of the Pt—Mn alloy, a palladium-manganese (Pd—Mn) alloy, a Pt—Mn—X (X=Ni, Pd, Rh, Ru, Ir, Cr, Co) alloy, or an alloy which has been used such as Ni—Mn or Fe—Mn may be used for the antiferromagnetic layer 1.

The pinned magnetic layer 2 is composed of a nickel-iron (Ni—Fe) alloy, cobalt (Co), an iron-cobalt (Fe—Co) alloy, an Fe—Co—Ni alloy, or the like.

A non-magnetic electrically conductive layer 3 having a low electrical resistance, composed of, for example, copper (Cu), is formed on the pinned magnetic layer 2, and a free magnetic layer 4 and a protective layer 7 composed of Ta or the like are further deposited thereon. The free magnetic layer 4 is composed of the magnetic material used for the pinned magnetic layer 2.

Next, a method for fabricating the layered structure including from the underlying layer 6 to the protective layer 7 will be described as follows.

After depositing the six layers from the underlying layer 6 to the protective layer 7 by sputtering, the non-magnetic electrically conductive layer 3, the free magnetic layer 4 and the protective layer 7 remain in the central part in the X direction while both sides (in the T1 regions) thereof are removed in the etching process, for example, by ion-milling. At this stage, although the pinned magnetic layer 2 may also be affected by etching and scraped off to a certain depth, it is preferable that the pinned magnetic layer 2 is not scraped off as much as possible. By keeping a little portion of the non-magnetic electrically conductive layer 3 on the pinned magnetic layer 2 in the T1 regions when the etching treatment is performed, the pinned magnetic layer 2 is not substantially affected by etching and the scrapings can be minimized.

As shown in FIG. 1, a non-magnetic layer 9 is deposited on the pinned magnetic layer 2 in the T1 regions and on the inclined edges of the non-magnetic electrically conductive layer 3, the free magnetic layer 4, and the protective layer 7. Also, a hard bias layer 5 and an electrically conductive layer 8 are deposited on the non-magnetic layer 9.

In accordance with the present invention, it is preferable that the non-magnetic layer 9 be composed of a metal layer having a body-centered cubic structure (bcc) and (100) orientation.

As the metal layer having a body-centered cubic structure as the crystal structure and (100) orientation, chromium (Cr), titanium (Ti), molybdenum (Mo), tungsten (W), or $W_{50}Mo_{50}$ (The suffix 50 means atomic percent.) can be used. The non-magnetic layer 9 may be formed with one of these materials or with a mixture of at least two.

The hard bias layers 5 and 5 are composed of, for example, a cobalt-platinum (Co—Pt) alloy or a cobalt-chromium-platinum (Co—Cr—Pt) alloy.

If the hard bias layer 5 composed of a Co—Pt alloy or the like is formed on the non-magnetic layer 9 composed of Cr or the like which has a body-centered cubic structure and (100) orientation, a coercive force Hc and a squareness ratio S corresponding to residual magnetization (Br)/saturation magnetic flux density (Bs) of the hard bias layer 5 increase. As a result, a bias magnetic field generating from the hard bias layer 5 increases.

Also, in accordance with the present invention, as shown in FIG. 1, since the hard bias layer 5 is formed on the pinned magnetic layer 2 in the T1 region with the non-magnetic layer 9 therebetween, the hard bias layer 5 formed on opposite sides of the free magnetic layer 4 is thicker in comparison with the related art, and therefore, a sufficient bias magnetic field is applied from the hard bias layer 5 to the free magnetic layer 4. Also, the hard bias layer 5 is not present on opposite sides of the pinned magnetic layer 2 and is formed apart from the pinned magnetic layer 2, and thus, the magnetic field from the hard bias layer 5 is not applied into the pinned magnetic layer 2, and is intensively applied into the free magnetic layer 4 with efficiency.

Accordingly, the free magnetic layer 4 in accordance with the present invention is properly put into a single magnetic domain state in the X direction in the entire region.

Also, since the hard bias layer 5 is formed on the pinned magnetic layer 2, not directly, but with the non-magnetic layer 9 therebetween, ferromagnetic coupling does not occur between the pinned magnetic layer 2 and the hard bias layer 5. Because of the presence of the non-magnetic layer 9, the magnetization of the hard bias layer 5 is shielded by the non-magnetic layer 9, and does not influence the magnetization of the pinned magnetic layer 2. As described above, the pinned magnetic layer 2 is not influenced by the hard bias layer 5, and thus, the pinned magnetic layer 2 is properly put into a single magnetic domain state in the Y direction in the entire region.

Differing from the related art, the pinned magnetic layer 2 and the antiferromagnetic layer 1 extend to the T1 region below the hard bias layer 5. Thus, the pinned magnetic layer 2 is pinned in the Y direction in a wider range than the track width, enabling further prevention in fluctuation of the magnetization of the pinned magnetic layer 2 caused by the magnetic field from a magnetic recording medium.

Also, in accordance with the present invention, even if the non-magnetic layer 9 is composed of a non-magnetic material, for example, $SiO_2$, instead of the metal layer having a body-centered cubic structure and (100) orientation, the magnetization of the pinned magnetic layer 2 and the free magnetic layer 4 can be aligned in the proper direction.

Figure 2:
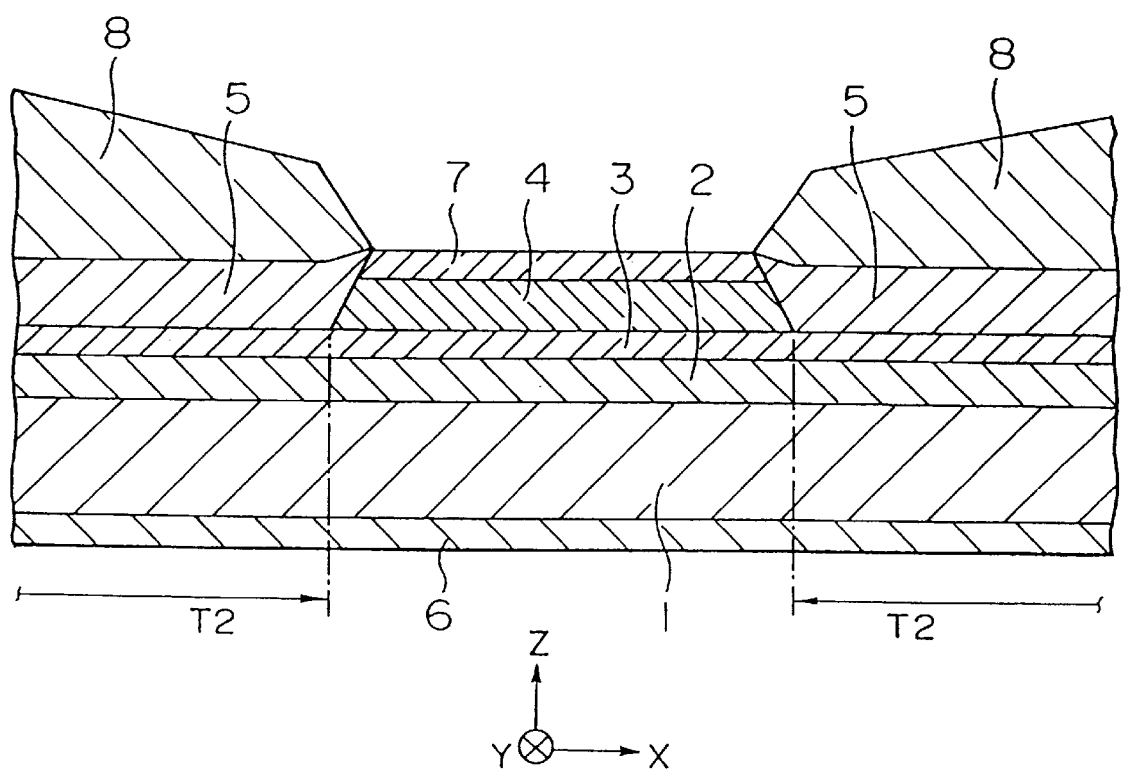
FIG. 2 is a sectional view which shows the structure of a spin-valve magnetoresistive element as a second embodiment of the present invention.

FIG. 2 is a variation to the spin-valve magnetoresistive element as an embodiment of the present invention shown in FIG. 1. A magnetic recording medium moves in the Z direction while the magnetic field leaked from the magnetic recording medium is directed in the Y direction.

In the spin-valve magnetoresistive element shown in FIG. 2, an underlying layer 6, an antiferromagnetic layer 1, a pinned magnetic layer 2, a non-magnetic electrically conductive layer 3, a free magnetic layer 4, and a protective layer 7 are deposited in that order from the bottom, in the same way as in the spin-valve magnetoresistive element shown in FIG. 1.

The pinned magnetic layer 2 is put into a single magnetic domain state and pinned in the Y direction by the exchange anisotropic coupling at the interface with the antiferromagnetic layer 1.

As shown in FIG. 2, the free magnetic layer 4 and the protective layer 7 remain in the central part in the X direction, and the underlying layer 6, the antiferromagnetic layer 1, the pinned magnetic layer 2, and the non-magnetic electrically conductive layer 3 further extend to the regions beside both sides in the X direction (T2 regions).

A hard bias layer 5 is deposited on the non-magnetic electrically conductive layer 3 in the T2 regions and on the inclined planes of the free magnetic layer 4 and the protective layer 7. Also, an electrically conductive layer 8 is formed on the hard bias layer 5. The hard bias layer 5 is put into a single magnetic domain state in the X direction, and the free magnetic layer 4 is put into a single magnetic domain state in the X direction by the bias magnetic field from the hard bias layer 5.

In comparison with the spin-valve magnetoresistive element shown in FIG. 1, in the spin-valve magnetoresistive element shown in FIG. 2, the non-magnetic electrically conductive layer 3 extends to the regions (T2 regions) beside both sides of the free magnetic layer 4. That is, in FIG. 2, the non-magnetic electrically conductive layer 3 in the T2 regions interposes between the hard bias layer 5 and the pinned magnetic layer 2, and thus, ferromagnetic coupling does not occur between the hard bias layer 5 and the pinned magnetic layer 2, and since the magnetic field leaked from the hard bias layer 5 is shielded by the non-magnetic electrically conductive layer 3, the leaked magnetic field does not influence the magnetization of the pinned magnetic layer 2.

Accordingly, the pinned magnetic layer 2 is properly put into a single magnetic domain state and pinned in the Y direction in the entire region.

Also, as shown in FIG. 2, since the hard bias layer 5 is formed on the non-magnetic electrically conductive layer 3, as is the free magnetic layer 4, the thick parts of the hard bias layer 5 which generate a strong magnetic field are formed on both sides of the free magnetic layer 4, and thus, the free magnetic layer 4 is properly put into a single magnetic domain state in the X direction. Also, the hard bias layer 5 is not present on both sides of the pinned magnetic layer 2 and is formed apart from the pinned magnetic layer 2, and thus, the magnetic field from the hard bias layer 5 is not applied into the pinned magnetic layer 2, and is intensively applied into the free magnetic layer 4 with efficiency.

Also, in the spin-valve magnetoresistive element shown in FIG. 2, a metal layer composed of, for example, Cr, having a body-centered cubic structure and (100) orientation described with reference to FIG. 1 may be deposited on the non-magnetic electrically conductive layer 3 in the T2 regions and on the inclined edges of the free magnetic layer 4 and the protective layer 7.

In such a structure, a coercive force Hc and a squareness ratio S of the hard bias layer 5 increase, and the bias magnetic field generating from the hard bias layer 5 increases. As a result, the magnetization of the free magnetic layer 4 is more easily put into a single magnetic domain state in the X direction.

Figure 3:
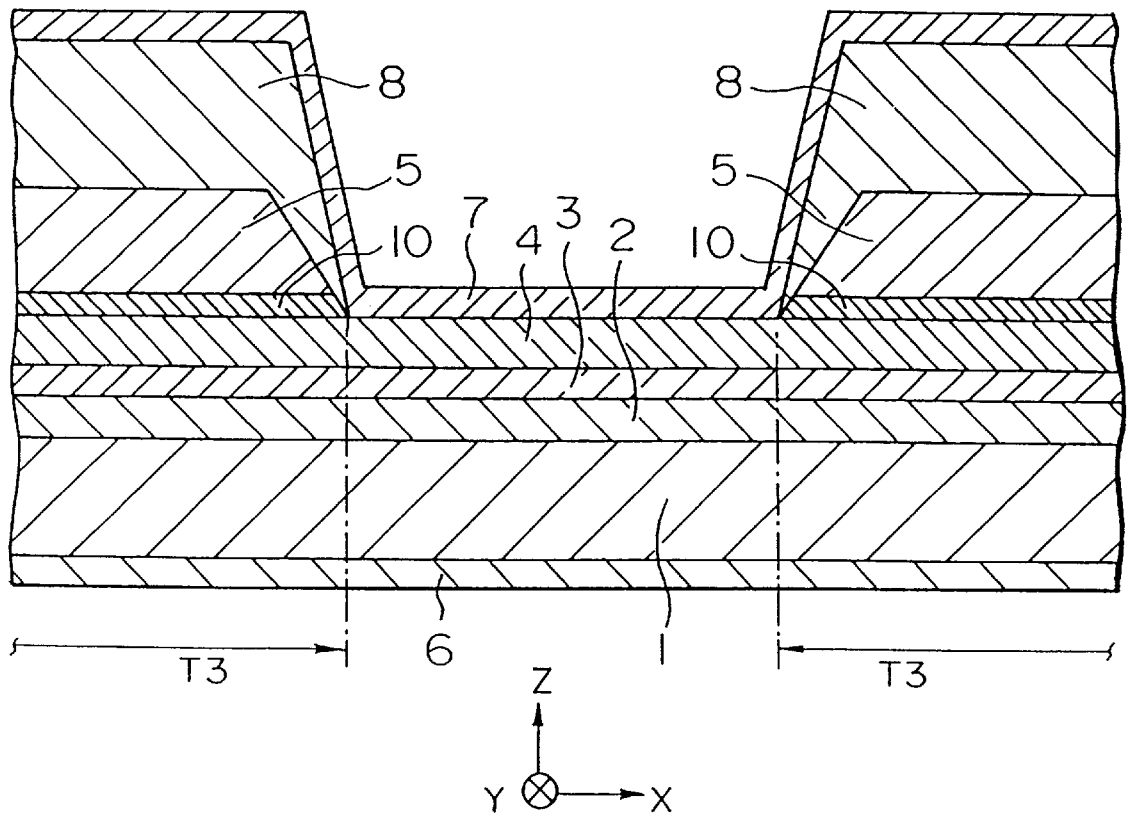
FIG. 3 is a sectional view which shows the structure of a spin-valve magnetoresistive element as a third embodiment of the present invention.
Figure 4:
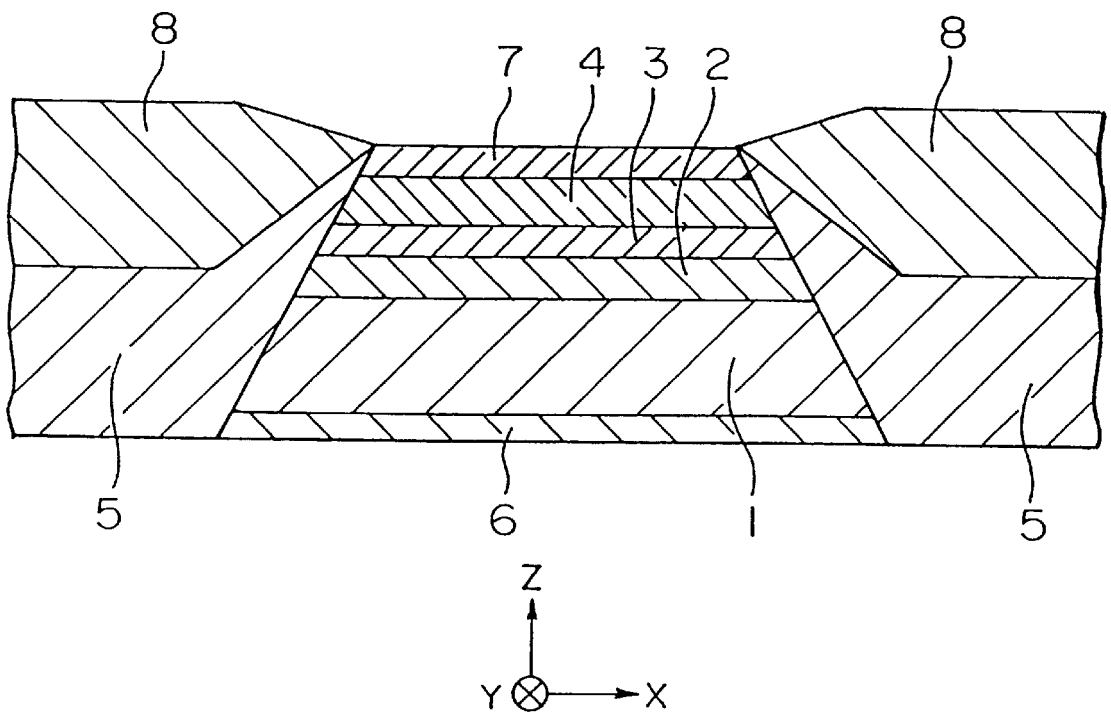
FIG. 4 is a sectional view which shows the structure of a conventional spin-valve magnetoresistive element.

FIG. 3 is a sectional view which shows the structure of a spin-valve magnetoresistive element as another embodiment of the present invention.

As shown in the drawing, an underlying layer 6, an antiferromagnetic layer 1, a pinned magnetic layer 2, a non-magnetic electrically conductive layer 3, and a free magnetic layer 4 are deposited in that order from the bottom. The pinned magnetic layer 2 is put into a single magnetic domain state by the exchange anisotropic magnetic field at the interface with the antiferromagnetic layer 1.

A ferromagnetic layer 10, a hard bias layer 5, and an electrically conductive layer 8 are deposited on the free magnetic layer 4, excluding a cut-out section in the central part, on both sides of the cut-out section (T3 regions).

A protective layer 7 is formed on the electrically conductive layer 8 and on the free magnetic layer 4.

In accordance with the present invention, the ferromagnetic layer 10 is a metal layer having a body-centered cubic structure and (100) orientation, composed of, for example, an Fe—X (X=Rh, Cr, Ti, Zr, Hf, V, Nb, Ta, Mn, Ru, Pd, Pt) alloy or an Fe—Co—Ni alloy.

Next, the mechanism of the single magnetic domain of the free magnetic layer 4 will be described. The hard bias layer 5 is magnetized in the X direction in the drawing.

The magnetization of the ferromagnetic layer 10 is put into a single magnetic domain state in the X direction by ferromagnetic coupling at the interface between the ferromagnetic layer 10 and the hard bias layer 5.

The magnetization of the free magnetic layer 4 in the T3 region is put into a single magnetic domain state in the X direction by ferromagnetic coupling at the interface between the free magnetic layer 4 and the ferromagnetic layer 10. The magnetization of the free magnetic layer 4 in the region excluding the T3 regions (in which the ferromagnetic layer 10 is not formed thereon) is gradually magnetized in the X direction by the magnetization of the free magnetic layer 4 which is put into a single magnetic domain state in the X direction in the T3 regions, and thus the entire free magnetic layer 4 is properly put into a single magnetic domain state in the X direction.

Also, the magnetic field leaked from the hard bias layer 5 directly flows into the free magnetic layer 4. Since the hard bias layer 5 is formed apart from the pinned magnetic layer 2, the magnetic field from the hard bias layer 5 is not applied into the pinned magnetic layer 2 and is intensively applied into the free magnetic layer 4 with efficiency. Thus, the free magnetic layer 4 is more easily put properly into a single magnetic domain state in the X direction.

Also, in the spin-valve magnetoresistive element shown in FIG. 3, the hard bias layer 5 is formed apart from the pinned magnetic layer 2, and therefore, the magnetic field leaked from the hard bias layer 5 does not influence the magnetization of the pinned magnetic layer 2. The pinned magnetic layer 2 is not influenced by the hard bias layer 5, and thus, the pinned magnetic layer 2 is properly put into a single magnetic domain state and pinned in the Y direction in the entire region.

The pinned magnetic layer 2 and the antiferromagnetic layer 1 also extend to the T3 region below the hard bias layer 5. Thus, the pinned magnetic layer 2 is pinned in the Y direction in a range wider than the track width, enabling further prevention in fluctuation of the magnetization of the pinned magnetic layer 2 caused by the magnetic field of a magnetic recording medium.

In the spin-valve magnetoresistive elements as the embodiments described above in detail, a stationary electric current (sensing current) is applied from the electrically conductive layer 8 into the pinned magnetic layer 2, the non-magnetic electrically conductive layer 3, and the free magnetic layer 4, and if the magnetic field from a recording medium is applied in the Y direction, the magnetization of the free magnetic layer 4 changes from the X direction to Y. At this stage, electrons, which transfer from one of the layers among the free magnetic layer 4 and the pinned magnetic layer 2 to the other layer, scatter at the interface between the non-magnetic electrically conductive layer 3 and the pinned magnetic layer 2, or at the interface between the non-magnetic electrically conductive layer 3 and the free magnetic layer 4, and the electrical resistance changes. Thus, the stationary electric current changes, and an output can be detected.

In accordance with the embodiments of the present invention, the pinned magnetic layer 2 is properly put into a single magnetic domain state in the Y direction, and the free magnetic layer 4 is properly put into a single magnetic domain state in the X direction, and thus the magnetization of the pinned magnetic layer 2 and the magnetization of the free magnetic layer 4 are perpendicular to each other in the entire region, resulting in the prevention of a servo error and the reduction of Barkhausen noise.

In accordance with the present invention described above in detail, by forming a hard bias layer, which applies a bias magnetic field into a free magnetic layer, on a pinned magnetic layer with a non-magnetic layer therebetween, the thick parts of the hard bias layer can be placed adjacent to both sides of the free magnetic layer. Also, in particular, if the non-magnetic layer is composed of a metal layer having a body-centered cubic structure and (100) orientation, the magnetic properties (coercive force and squareness ratio) of the hard bias layer can be enhanced, and the magnetization of the free magnetic layer can be properly put into a single magnetic domain state in the direction perpendicular to the magnetic direction of the pinned magnetic layer.

Also, by interposing the non-magnetic layer between the hard bias layer and the pinned magnetic layer, ferromagnetic coupling can be prevented, the magnetization of the hard bias layer can be shielded by the non-magnetic layer, and thus, the pinned magnetic layer is not influenced by the magnetization of the hard bias layer. Therefore, the magnetization of the pinned magnetic layer can be properly put into a single magnetic domain state and pinned in a given direction.

Also, in accordance with the present invention, a ferromagnetic layer having a body-centered cubic structure and (100) orientation is formed on the free magnetic layer at a given space, and the hard bias layer is formed on the ferromagnetic layer. Thus, by ferromagnetic coupling, the magnetization of the free magnetic layer can be properly put into a single magnetic domain state in the direction perpendicular to the magnetic direction of the pinned magnetic layer.

Also, with such a structure, since the hard bias layer can be formed apart from the pinned magnetic layer, the pinned magnetic layer is not influenced by the hard bias layer, and therefore, the magnetization of the pinned magnetic layer can be properly put into a single magnetic domain state and pinned in a given direction.

As described above, in accordance with the present invention, the pinned magnetic layer and the free magnetic layer can be properly put into single magnetic domain states in given directions, and thus, satisfactory micro-track-asymmetry can be obtained, a servo error can be prevented, and Barkhausen noise can be reduced.

What is claimed is:

1. A spin-valve magnetoresistive element comprising:

an antiferromagnetic layer;

a pinned magnetic layer formed on said antiferromagnetic layer, a magnetic direction of said pinned magnetic layer being pinned by an exchange anisotropic magnetic field between said pinned magnetic layer and said antiferromagnetic layer;

a non-magnetic electrically conductive layer and a free magnetic layer deposited thereon;

a bias layer to align a magnetic direction of said free magnetic layer in a direction perpendicular to the magnetic direction of said pinned magnetic layer; and an electrode layer to apply a sensing current into said pinned magnetic layer, said non-magnetic electrically conductive layer, and said free magnetic layer, wherein said antiferromagnetic layer, said pinned magnetic layer, and said non-magnetic electrically conductive layer extend to regions beside both sides of said free magnetic layer, said bias layer is formed on said non-magnetic electrically conductive layer in said regions beside both sides of said free magnetic layer while said non-magnetic electrically conductive layer is disposed between said pinned magnetic layer and said bias layer such that said pinned magnetic layer is magnetically shielded from said bias layer, said electrode layer is formed on said bias layer, and each side of said free magnetic layer contacts a corresponding bias layer such that a bias magnetic field from said bias layer is applied to said free magnetic layer.

2. A spin-valve magnetoresistive element according to claim 1, wherein a non-magnetic metal layer having a body-centered cubic structure and (100) orientation is formed between said non-magnetic electrically conductive layer and said bias layer.

3. A spin-valve magnetoresistive element according to claim 2, wherein said metal layer comprises Cr, Ti, Mo, or $W_{50}Mo_{50}$.

* * * * *